(12) United States Patent
Takashima et al.

(10) Patent No.: US 8,044,569 B2
(45) Date of Patent: Oct. 25, 2011

(54) LIGHT EMITTING DEVICE

(75) Inventors: Suguru Takashima, Anan (JP); Masato Aihara, Anan (JP); Junji Takeichi, Anan (JP); Takahiro Naitou, Anan (JP); Hiroto Tamaki, Anan (JP); Tomohisa Kishimoto, Anan (JP)

(73) Assignee: Nichia Corporation, Anan-shi (JP)

( * ) Notice: Subject to any disclaimer, the term of this patent is extended or adjusted under 35 U.S.C. 154(b) by 984 days.

(21) Appl. No.: 11/922,125

(22) PCT Filed: Jun. 15, 2006

(86) PCT No.: PCT/JP2006/312026
§ 371 (c)(1),
(2), (4) Date: Dec. 13, 2007

(87) PCT Pub. No.: WO2006/135005
PCT Pub. Date: Dec. 21, 2006

(65) Prior Publication Data
US 2010/0277054 A1    Nov. 4, 2010

(30) Foreign Application Priority Data

Jun. 15, 2005 (JP) ............... P 2005-174518

(51) Int. Cl.
*H01J 1/62* (2006.01)
*H01J 61/42* (2006.01)
*H01L 33/50* (2010.01)
(52) U.S. Cl. ......... 313/501; 313/486; 313/487; 313/512
(58) Field of Classification Search .................. 313/501, 313/512, 485–487
See application file for complete search history.

(56) References Cited

U.S. PATENT DOCUMENTS

| | | | |
|---|---|---|---|
| 6,613,247 B1 * | 9/2003 | Hohn et al. | 252/301.36 |
| 6,686,691 B1 * | 2/2004 | Mueller et al. | 313/503 |
| 6,717,353 B1 | 4/2004 | Mueller et al. | |
| 6,817,735 B2 | 11/2004 | Shimizu et al. | |
| 7,273,568 B2 * | 9/2007 | Nagatomi et al. | 252/301.4 F |
| 2002/0070681 A1 | 6/2002 | Shimizu et al. | |
| 2003/0006702 A1 | 1/2003 | Mueller-Mach et al. | |
| 2006/0076883 A1 | 4/2006 | Himaki et al. | |

FOREIGN PATENT DOCUMENTS

| | | |
|---|---|---|
| EP | 1 659 335 A1 | 5/2006 |
| JP | 2003-45206 A | 2/2003 |

(Continued)

*Primary Examiner* — Mariceli Santiago
(74) *Attorney, Agent, or Firm* — Birch, Stewart, Kolasch & Birch, LLP

(57) ABSTRACT

A light emitting device includes a wavelength converting member for absorbing light emitted by an exciting light source and emitting light of a different wavelength. With a wavelength at which the light from the exciting light source has a maximum energy intensity denoted as a first wavelength, a wavelength at which the light from the wavelength converting member has a maximum energy intensity denoted as a second wavelength, a wavelength lying between the first and second wavelengths at which the light from the light emitting device has a minimum energy intensity denoted as a third wavelength, and 650 nm denoted as a fourth wavelength, then the light emitting device has an emission spectrum such that the proportion of the energy intensity at the first wavelength to the energy intensity at the third wavelength is in a range from 100:15 to 100:150, and the proportion of the energy intensity at the first wavelength to the energy intensity at the fourth wavelength is in a range from 100:45 to 100:200.

14 Claims, 10 Drawing Sheets

FOREIGN PATENT DOCUMENTS

| | | |
|---|---|---|
| JP | 2003-273409 A | 9/2003 |
| JP | 2003-318447 A | 11/2003 |
| JP | 2004-80046 A | 3/2004 |
| JP | 2004-134805 A | 4/2004 |
| JP | 2004-210921 A | 7/2004 |
| JP | 2005-8844 A | 1/2005 |
| JP | 2005-150691 A | 6/2005 |

* cited by examiner

LIGHT EMITTING DEVICE

TECHNICAL FIELD

The present invention relates to a light emitting device used in a liquid crystal backlight light source, lighting apparatus, backlight light source for display, flash of a camera, auxiliary light source for movies, etc., and particularly to a light emitting device requiring color rendering performance.

BACKGROUND ART

The fluorescent lamp is used as a popular lighting apparatus. However, growing concern for environmental pollution increases the demand for light sources which are free of mercury, and light emitting devices based on light emitting elements such as light emitting diodes (hereinafter referred to as LEDs) or laser diodes (hereinafter referred to as LDs) are attracting much attention.

Light emitting devices based on the light emitting elements are small in size, high in power efficiency and are capable of emitting light of vivid colors. Furthermore, such light emitting elements are semiconductor devices free of failure such as burnout. These light emitting elements also have such advantages as excellent startup characteristics and high tolerance to vibration and to repetitive turning ON/OFF. Because of such excellent characteristics, light emitting devices based on light emitting elements such as LEDs and LDs are used widely in various light sources.

Regarding white light emitting devices based on LEDs, known methods consist of combinations of the following two types.

The first type is a light emitting device that combines a blue LED and a YAG fluorescent material which emits yellow light. The light emitting device emits white light by blending blue light and yellow light, whereas the YAG fluorescent material is excited by the blue light emitted by the blue LED. The light emitting device has the advantages of reduction in power consumption, easy control of the LED operation and good color blending performance, and therefore has been widely used.

The second type is a light emitting device that combines a blue LED, a green LED and a red LED. This light emitting device is the so-called three-wavelength light emitting device that generates white light by blending the light from the three LEDs. The light emitting device is capable of reducing the power consumption, and has a wide range of display colors for light that passes through the liquid crystal. There is also a light emitting device that combines a blue LED, a blue-green LED, an orange LED and a red LED in order to improve the efficiency and color rendering performance (for example, Patent Document 1).

Patent Document 1: Japanese Unexamined Patent Publication (Kokai) No. 2003-45206

DISCLOSURE OF INVENTION

However, the first light emitting device combines blue light and yellow light, and therefore has lower radiant flux in the blue-green region and in the red region than that of an incandescent lamp, thus resulting in uneven distribution of radiant flux intensity in the visible light region.

The second light emitting device has difficulty in blending colors and poor color rendering performance. Since light emitted by an LED is sharp unlike the light emitted by a fluorescent lamp, it is difficult to achieve a continuous emission spectrum by blending the light from different LEDs. The energy intensity is particularly low in regions between the emission peaks of the LEDs. Also because three or more LEDs are required to make one light source, it becomes complicated to control the operation thereof and it is also difficult to adjust the color tone.

When illuminated with the light emitted by such a light emitting device, an object may appear to have a surface color different from that when illuminated by a continuous-spectrum white light such as light from the sun or an incandescent lamp.

A light emitting device that employs an ultraviolet LED instead of a blue LED is also known. A light emitting device that employs an ultraviolet LED and a fluorescent material is capable of reducing the unevenness in radiant flux intensity distribution in the visible light region. However, since light emitted by the light emitting device includes ultraviolet rays, measures must be taken to prevent the ultraviolet rays from escaping to the outside. The ultraviolet rays also accelerate the degradation of the components. Also, because the ultraviolet LED is practically undetectable by the naked eye, ultraviolet rays escaping from the light emitting device are useless as visual light, thus resulting in lower luminous efficiency.

Based on the considerations described above, the present invention purposes to provide a light emitting device that is capable of reducing the unevenness in radiant flux intensity distribution in the visible light region and has a continuous spectrum similar to that of light from the sun or an incandescent lamp.

Through dedicated researches aimed at solving the problems described above, the inventors of the present application completed the invention.

The light emitting device of the present invention comprises a exciting light source that emits light of short wavelength in the visible light region and a wavelength converting member that absorbs light from the exciting light source and emits light of a wavelength longer than that of the light from the exciting light source, such that the light emitting device emits light with a color temperature in a range from 4,000K to 5,000K, wherein the light emitting device has a visible light emission spectrum with a wavelength at which the light from the exciting light source has a maximum energy intensity denoted as a first wavelength, a wavelength at which the light from the wavelength converting member has a maximum energy intensity denoted as a second wavelength, a wavelength lying between the first and second wavelengths at which the light from the light emitting device has a minimum energy intensity denoted as a third wavelength, and 650 nm denoted as a fourth wavelength, such that the proportion of the energy intensity at the first wavelength to the energy intensity at the third wavelength is from 100:15 to 100:150, and the proportion of the energy intensity at the first wavelength to the energy intensity at the fourth wavelength is from 100:45 to 100:200. With this constitution, a light emitting device having a continuous spectrum similar to that of light from the sun or an incandescent lamp is provided. It is also possible to increase the intensity of emission in the red region and improve the color rendering performance. Moreover, because the light emitting device employs an exciting light source that emits visible light, ultraviolet rays are hardly emitted so that degradation of components is avoided and there is no need to take preventive measures for leakage of ultraviolet rays. The proportion of the energy intensity at the first wavelength to the energy intensity at the third wavelength is more preferably (Energy intensity at the first wavelength):(Energy intensity at the third wavelength)=100:20 to 100:100, which enables higher color rendering performance while maintaining high luminance. It is particularly preferable to set the proportion of the energy intensity at the first wavelength to the energy intensity at the fourth wavelength is more preferably (Energy intensity at the first wavelength): (Energy intensity at the fourth wavelength)=100:45 to 100:100, which enables higher luminance, higher special color rendering index (R9) and higher intensity of emission in the red region.

As the wavelength converting member absorbs light from the exciting light source, an increase in the proportion of light absorbed by the wavelength converting member leads to a smaller proportion of light emitted by the exciting light source that emerges to the outside, thus making it difficult to produce light of the predetermined color temperature and color tone. For this reason, the exciting light source and the wavelength converting member are selected so that the energy intensity at the first wavelength and the energy intensities at the second through fourth wavelengths fall in the predetermined range.

It is preferable that the light emitting device has a general color rendering index in a range from 75 to 99, which enables a light emitting device with higher color rendering performance.

It is preferable that the exciting light source is a light emitting element, and that the wavelength converting member comprises one fluorescent material or two or more kinds of fluorescent material having different compositions. Such a constitution enables a light emitting device of smaller size and high power efficiency.

It is preferable that the emission spectrum is characterized by a proportion of the energy intensity at the first wavelength to the energy intensity at a fifth wavelength being (Energy intensity at first wavelength) (Energy intensity at fifth wavelength)=100:25 to 100:200, where the fifth wavelength is 680 nm. This constitution further increases the intensity of emission in the red region thereby to provide a continuous emission spectrum like that of light from the sun or an incandescent lamp. The proportion of the energy intensity at the first wavelength to the energy intensity at the fifth wavelength is more preferably (Energy intensity at first wavelength):(Energy intensity at the fifth wavelength)=100:30 to 100:100, which enables an increase of the special color rendering index (R9) and an increase in the intensity of emission in the red region.

The wavelength converting member preferably comprises a nitride fluorescent material that includes at least one kind of group II element selected from the group consisting of Be, Mg, Ca, Sr, Ba and Zn; at least one kind of group IV element selected from the group consisting of C, Si, Ge, Sn, Ti, Zr and Hf; and at least one kind of group III element selected from the group consisting of Al, B and N with N included as an indispensable element, and is activated with at least one kind of rare earth element selected from the group consisting of Y, La, Ce, Pr, Nd, Sm, Eu, Gd, Tb, Dy, Ho, Er and Lu. The nitride fluorescent material of such a composition has an emission peak at a longer wavelength in the visible light region, and therefore has higher energy intensity in the red region. The nitride fluorescent material also has a broad emission spectrum and therefore enables a light emitting device of high color rendering performance. Moreover, the nitride fluorescent material has higher heat resistance than a fluorescent material based on sulfide or the like, and is less susceptible to thermal degradation.

The present invention is capable of providing a light emitting device having mitigated unevenness in radiant flux intensity distribution in the visible light region, and also providing a light emitting device having high luminance with a continuous emission spectrum similar to that of light from the sun or an incandescent lamp. The present invention is also capable of providing a light emitting device having high color rendering performance with an improved color rendering index which is one indicator of the quality of illuminating light.

Figure 1:
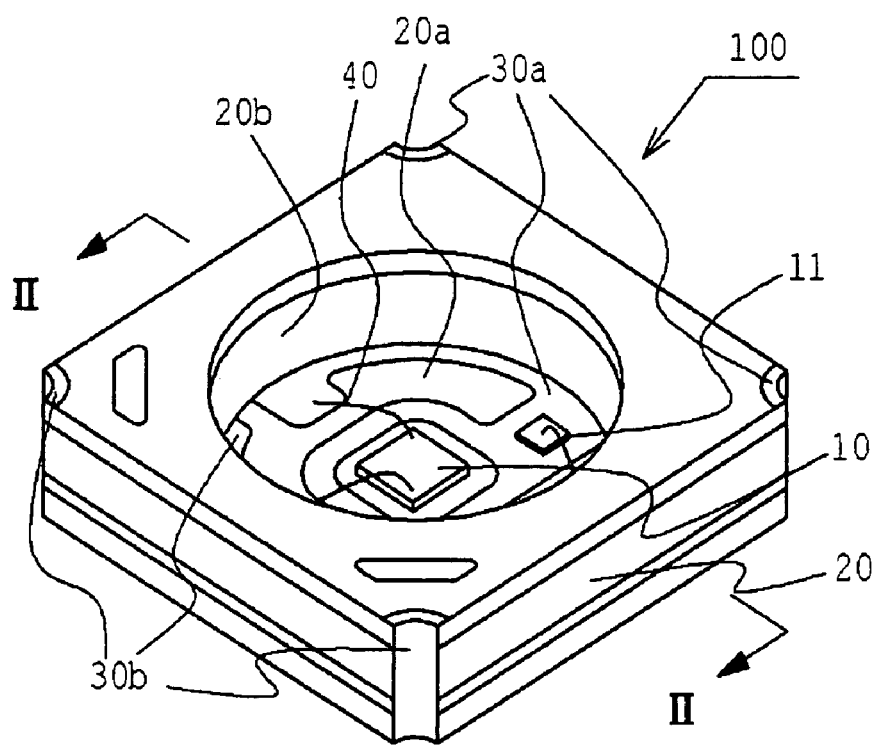
FIG. 1 is a schematic perspective view showing a light emitting device according to an embodiment of the invention.

| (Brief Description of the Reference Numerals) | |
|---|---|
| 10 | Light emitting element |
| 11 | Protective element |
| 20 | Package |
| 20a | Bottom surface |
| 20b | Side face |
| 30a | First electrode |
| 30b | Second electrode |
| 40 | Wire |
| 50 | Wavelength converting member |
| 51 | Resin |
| 52 | Fluorescent material |

BEST MODE FOR CARRYING OUT THE INVENTION

The light emitting device and a method for manufacturing the same according to the present invention will now be described by way of embodiment and Examples. It is understood, however, that the present invention is not limited to the embodiment and Examples.

Figure 2:
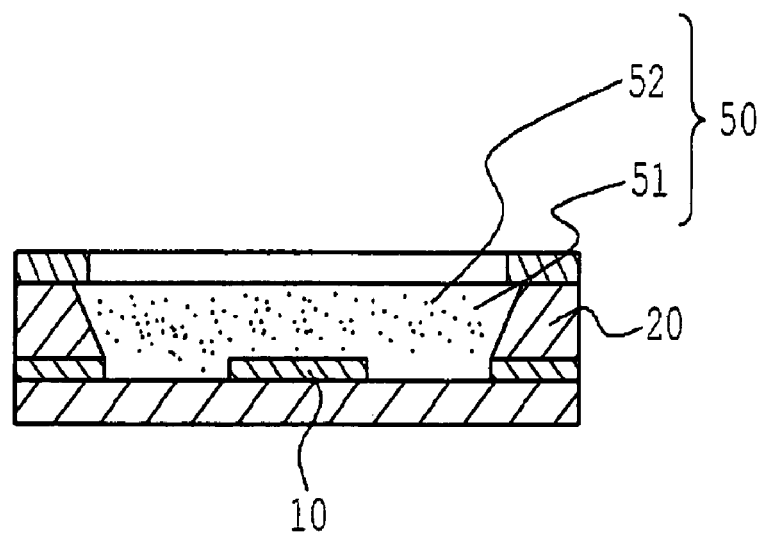
FIG. 2 is a sectional view showing the light emitting device of the embodiment taken along lines II-II.

FIG. 1 is a schematic perspective view showing the light emitting device according to an embodiment of the present invention. In FIG. 1, the wavelength converting member 50 is omitted for the sake of clearness. FIG. 2 is a sectional view showing a light emitting device according to the embodiment taken along lines II-II.

The light emitting device 100 comprises a light emitting element 10 serving as an exciting light source, a package 20 having a recess constituted from a bottom surface 20a on which a light emitting element 10 is mounted thereon and a side face 20b extending from the bottom surface 20a, and a wavelength converting member 50. A first electrode 30a and a second electrode 30b are installed on a portion of the bottom surface 20a in the recess of the package 20. The first electrode 30a is connected to a corner and back face on the outside of the package 20, while said outside corner and the back face are electrically connected to an external electrode. Similarly, the second electrode 30b is connected to the corner and the back face on the outside of the package 20, while the outside corner and the back face are electrically connected to an external electrode. The light emitting element 10 is mounted on the first electrode 30a that is provided on the bottom surface in the recess of the package 20. For the wavelength converting member 50, a fluorescent material 52 mixed in a resin 51 is used.

The light emitting element 10 is formed from, for example, a compound semiconductor based on GaN, in such a constitution as an n-type compound semiconductor layer formed on an insulating sapphire substrate, and a p-type compound semiconductor layer formed thereon. While the light emitting element 10 is mounted on the first electrode 30a with the sapphire substrate facing down, the light emitting element 10 may also be mounted on the first electrode 30a with the compound semiconductor side facing down. An n-side electrode formed on the n-type layer is electrically connected by a wire 40 to the first electrode 30a. A p-side electrode formed on the p-type layer is electrically connected by a wire 40 to the second electrode 30b. The first electrode 30a and the second electrode 30b are a pair of positive and negative electrodes. The light emitting element 10 may be formed from a semiconductor based on InGaN, AlGaN, InAlGaN or the like as well as GaN. The light emitting element 10 is formed of a semiconductor that emits light of a short wavelength in the visible light region such as bluish purple light, blue light or green light. It is preferable that the light emitting element 10 has a peak emission wavelength in a range from 400 nm to 495 nm, more preferably in a range from 440 nm to 495 nm, because said wavelength range enables effective use of the transmitted light unable to be absorbed by the fluorescent material 52, ultraviolet rays are not emitted to the outside and the energy level is high.

The package 20 has a recess that opens upward. The recess has a bottom surface 20a where the light emitting element 10 is mounted and a side face 20b extending from the bottom surface 20a. There is no particular restriction on the configuration of the package 20, and the bottom of the package 20 may have various shapes such as circular, elliptical, rectangular, polygonal or a modification thereof. There is no particular restriction on the size of the package 20 which may be, for example, from 0.1 $mm^2$ to 100 $mm^2$. Thickness of the package 20 may be in a range from 100 μm to 20 mm. The package 20 is made of ceramics, although the present invention is not limited to this constitution and known materials such as heat-resistant thermoplastic engineering polymers or thermosetting resins may be used individually or in a combination of two kinds or more thereof. For example, liquid crystal polymer (LCP), polyphenylene sulfide (PPS), aromatic nylon (PPA), epoxy resin, hard silicone resin or the like may be used. Among these, a thermoplastic engineering polymer is preferably used due to cost advantages. The package 20 may also include additives including but not limited to one or a combination of two or more kinds of inorganic fillers such as titanium oxide, zinc oxide, alumina, silica, barium titanate, calcium phosphate, calcium carbonate, white carbon, talc, magnesium carbonate, boron nitride, glass fibers or the like. Moreover, additives such as anti-oxidization agents, thermal stabilizers, light stabilizers or the like may be added as required. While the recess of the package 20 has a circular opening, the opening may be formed in an elliptical, rectangular, polygonal or a modified shape thereof.

The first electrode 30a and the second electrode 30b are molded integrally with the ceramic package 20. The first electrode 30a and the second electrode 30b may be finished by electroless plating, or may be a copper foil patterned and formed by such processes as exposure, etching and removal of resist mask, followed by electroplating with nickel and gold. The first electrode 30a and the second electrode 30b can be formed alternatively from a good heat conductor such as an alloy of copper or iron, which may be plated with silver, aluminum, gold or the like on the surface thereof.

The light emitting element 10 is mounted via a bonding member directly on the first electrode 30a. The protective element 11 is also mounted on the first electrode 30a. Alternatively, the light emitting element 10 may also be mounted on the protective element 11 that is mounted on the first electrode 30a via a bonding member. The protective element 11 is an element that is housed together with semiconductor elements such as the light emitting element 10 in the recess of the package 20, and protects the other semiconductor elements from destruction by an over voltage. The protective element 11 may or may not have a semiconductor structure. For the protective element 11, for example, a zener diode, capacitor, diac or the like may be used.

A zener diode comprises a p-type semiconductor region having a positive electrode and an n-type semiconductor region having a negative electrode, with the negative electrode and the positive electrode of the protective element being connected to the p-side electrode and the n-side electrode of the light emitting element, respectively, in reverse parallel connection. Thus, when a zener diode is used as the protective element, the voltage across the positive and negative electrodes of the light emitting element is held at the zener voltage even when an over voltage is applied across the positive and negative electrodes, so as to protect the light emitting element from an excessive voltage and prevent destruction and feature degradation.

For a capacitor, a surface-mounted chip may be used. A capacitor of such a construction has band-shaped electrodes provided on either side, and these electrodes are connected to the positive and negative electrodes of the light emitting element in parallel connection. When excessive voltage is applied across the positive and negative electrodes, the over voltage causes a charging current to flow into the capacitor, thus instantaneously decreasing the voltage across the capacitor, so that the voltage applied across the light emitting element does not increase, thereby protecting the light emitting element from the over voltage. Also, when the element receives noise having a high frequency component, the capacitor functions as a bypass capacitor so as to shut out the extraneous noise.

It is preferable to use the wavelength converting member 50 comprising the fluorescent material 52 mixed in the resin 51. The resin 51 may further include a filler, dispersant, pigment, light absorbing agent or the like mixed therein. Instead of the fluorescent material 52 or together with the fluorescent material 52, a fluorescent dye may be used. The fluorescent material 52 absorbs light from the light emitting element 10 and emits light of a wavelength longer than that of the light from the light emitting element. This constitution has a high efficiency of energy conversion. While the resin 51 itself does not cause a significant change in wavelength, said resin allows the easy fixation of the fluorescent material 52 which is capable of wavelength conversion. The wavelength converting member 50 is thus formed by combining the fluorescent material 52 and the resin 51. The resin 51 may be highly heat-resistant silicone resin or epoxy resin, amorphous polyamide resin, fluorocarbon resin or the like. It is preferable to use a rare earth element aluminate fluorescent material activated by rare earth elements such as Ce and a nitride fluorescent material activated by rare earth elements such as Eu to manufacture the light emitting device that emits white light in order to achieve high color rendering performance and high luminance, although the present invention is not limited to this constitution and various fluorescent materials can be used.

The light emitting device 100 emits light generated by blending the light from the light emitting element 10 and the light from the wavelength converting member 50. It is preferable to adjust the wavelength of the light emitted by the light emitting element 10 and adjust the wavelength of the spectral distribution of the light from the wavelength converting member 50, so that color temperature of the light emitted by the light emitting device 100 is in a range from 4,000K to 5,000K. Spectral distribution can be adjusted by controlling the composition and quantity of the fluorescent material 52 included in the wavelength converting member 50.

The emission spectrum of the light emitting device 100 in the visible light region is such that, with a wavelength at which the light from the exciting light source 10 has a maximum energy intensity denoted as the first wavelength, a wavelength at which the light from the wavelength converting member has a maximum energy intensity denoted as the second wavelength, a wavelength lying between the first and second wavelengths at which the light from the light emitting device has a minimum energy intensity denoted as the third wavelength, and 650 nm denoted as the fourth wavelength, then the proportion of the energy intensity at the first wavelength to the energy intensity at the third wavelength is (Energy intensity at first wavelength):(Energy intensity at third wavelength)=100:15 to 100:150, and the proportion of the energy intensity at the first wavelength to the energy intensity at the fourth wavelength is (Energy intensity at first wavelength):(Energy intensity at fourth wavelength)=100:45 to 100:200. For example, when an exciting light source that emits blue light (first wavelength region) and a wavelength converting member that emits green to yellow light (second wavelength region) are used, a continuous emission spectrum can be obtained by increasing the intensity of bluish green light (third wavelength region). For example, when the light emitting element 10 having a peak emission wavelength at about 450 nm (the first wavelength) and the fluorescent material 52 having a peak emission wavelength at about 530 nm or about 650 nm (the second wavelength) are used, a minimum value of energy intensity appears at about 480 nm (the third wavelength). Letting the energy intensity at about 450 nm be 100, then the energy intensity at about 480 nm is in the relative range from 20 to 40. The light emitting device 100 emits light with a general color rendering index in a range from 75 to 99. It is preferable to have light emitted with general color rendering index in a range from 85 to 100, more preferably from 91 to 99. While the above description assumes that the light emitting element 10 has peak emission wavelength at 450 nm, the present invention is not limited to this wavelength, and a light emitting element having a peak emission wavelength at 440 nm or 420 nm may also be used. When the light emitting element 10 having a peak emission wavelength in the short wavelength portion of the visible light region (from 400 nm to 420 nm) is used, a material having a peak emission wavelength in the short wavelength portion of the visible light region is used also for the fluorescent material 52. This constitution enables it to provide the light emitting device 100 having increased energy intensity at the third wavelength.

The light emitting device of the prior art employs a light emitting element having peak emission (energy intensity) at a wavelength of about 450 nm (the first wavelength) and a fluorescent material having a peak emission (energy intensity) at a wavelength of about 560 nm (the second wavelength). In this case, a minimum value of energy intensity appears in a range from about 485 nm to 500 nm (the third wavelength). Letting the energy intensity at about 450 nm be 100, then the energy intensity in a range from about 485 nm to 500 nm is 10 or less. It is required to provide considerably higher color rendering performance than that of this light emitting device of prior art.

Unlike the light emitting device of prior art that employs the 3-wavelength LED, the light emitting device 100 of the present invention has a continuous spectrum and therefore can emit light like that from the sun or an incandescent lamp.

The general color rendering index and the special color rendering index (R9) vary when the color temperature is different. Therefore even light sources having similar emission intensity spectra cannot be accurately compared if the light sources have different color temperatures. But it can be that the color rendering performance of a light source having color temperature in a range from 4,000K to 5,000K can be improved by setting the energy intensities at the first wavelength, the second wavelength and the third wavelength in predetermined ranges.

"Short wavelength in visible light region" as mentioned in this specification means a region of wavelengths $\lambda p$ between 380 nm and 495 nm. "Ultraviolet region" means a region of wavelengths $\lambda p$ shorter than 380 nm. Light emission characteristics of Example and Comparative Example given in this specification were measured by a method based on JIS Z 8724-1997. Based on the measurements, general color rendering indexes and special color rendering indexes were calculated according to JIS Z 8726-1990.

Fluorescent Material

It is preferable that the fluorescent material 52 is included in the resin 51.

There is no restriction on the fluorescent material 52 as long as it can absorb the light from a semiconductor light emitting element having a light emitting layer formed from a nitride semiconductor and emit light of a different wavelength. It is preferable to use at least one selected from among a nitride-based fluorescent material or an oxynitride-based fluorescent material activated mainly with lanthanoid elements such as Eu or Ce; alkaline earth element halogen apatite fluorescent material, alkaline earth metal element boride halogen fluorescent material, alkaline earth metal element aluminate fluorescent material, alkaline earth element silicate fluorescent material, alkaline earth element sulfide fluorescent material, alkaline earth element thiogalate fluorescent material, alkaline earth element silicon nitride fluorescent material or germanate fluorescent material, activated mainly with lanthanoid elements such as Eu or transition metal elements such as Mn; rare earth element aluminate fluorescent material or rare earth element silicate fluorescent material activated mainly with lanthanoid elements such as Ce; and organic compounds or organic complexes activated mainly with lanthanoid elements such as Eu. For example, the fluorescent materials cited below may be used, but the present invention is not limited to these materials.

Oxynitride-based fluorescent materials activated mainly with lanthanoid elements such as Eu or Ce include $M_2Si_5N_8$:Eu (M is at least one element selected from among Sr, Ca, Ba, Mg and Zn). In addition to $M_2Si_5N_8$:Eu, there are also $MSi_7N_{10}$:Eu, $M_{1.8}Si_5O_{0.2}N_8$:Eu and $M_{0.9}Si_7O_{0.1}N_{10}$:Eu (M is at least one element selected from among Sr, Ca, Ba, Mg and Zn).

There are also nitride fluorescent materials that include group II elements M, Si, Al and N and are activated mainly with rare earth elements such as Eu, so as to absorb light in a region from ultraviolet to blue and emits light in a region from yellowish red to red. Such nitride fluorescent materials are represented by a general formula $M_wAl_xSi_yN_{(2/3)W+X+(4/3)Y}$:Eu and include at least one kind of element selected from among rare earth elements, tetravalent elements and trivalent elements. M is at least one element selected from among Mg, Sr, Ca and Ba.

In the general formula described above, w, x and y preferably satisfy relationships of $0.04 \leq w \leq 9$, $x=1$, $0.056 \leq y \leq 18$, or may satisfy relationships of $0.04 \leq w \leq 3$, $x=1$, $0.143 \leq y \leq 8.7$, and more preferably satisfy relationships of $0.05 \leq w \leq 3$, $x=1$, $0.167 \leq y \leq 8.7$.

The nitride fluorescent material may also include boron B in a composition represented by a general formula $M_WAl_X Si_YB_ZN_{(2/3)W+X+(4/3)Y+Z}$:Eu. In this general formula, M is at least one element selected from among Mg, Sr, Ca and Ba, and w, x, y and z satisfy relationships of $0.04 \leq w \leq 9$, $x=1$, $0.056 \leq y \leq 18$, and $0.0005 \leq z \leq 0.5$. When boron is added, the molar concentration z of boron is set not higher than 0.5, preferably not higher than 0.3 and not lower than 0.0005. More preferably, molar concentration z of boron is set in a range from 0.001 to 0.2.

These nitride fluorescent materials include at least one kind of element selected from the group consisting of La, Ce, Pr, Gd, Tb, Dy, Ho, Er and Lu, or at least one kind of element selected from among Sc, Y, Ga and In, or at least one kind of element selected from among Ge and Zr. Including these elements enables it to provide luminance, quantum efficiency or peak intensity equivalent to or higher than the case of Gd, Nd, Tm.

Oxynitride-based fluorescent materials activated mainly with lanthanoid elements such as Eu or Ce include $MSi_2O_2N_2$:Eu (M is at least one element selected from among Sr, Ca, Ba, Mg and Zn).

The alkaline earth element halogen apatite fluorescent materials activated mainly with lanthanoid elements such as Eu or transition metal elements such as Mn include $M_5(PO_4)_3 X$:R (M is at least one element selected from among Sr, Ca, Ba, Mg and Zn, X is at least one element selected from among F, Cl, Br and I, and R is at least one element selected from among Eu, Mn and a combination of Eu and Mn).

The alkaline earth metal element halogen-borate fluorescent materials include $M_2B_5O_9X$:R (M is at least one element selected from among Sr, Ca, Ba, Mg and Zn, X is at least one element selected from among F, Cl, Br and I, and R is at least one element selected from among Eu, Mn and a combination of Eu and Mn).

The alkaline earth metal element aluminate fluorescent materials include $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R and $BaMgAl_{10}O_{17}$:R (R is at least one element selected from among Eu, Mn and a combination of Eu and Mn).

The alkaline earth metal sulfide-based fluorescent materials include $La_2O_2S$:Eu, $Y_2O_2S$:Eu, and $Gd_2O_2S$:Eu.

The rare earth metal aluminate-based fluorescent materials activated mainly with lanthanoid elements such as Ce include YAG fluorescent materials having compositions of $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce and $(Y, Gd)_3(Al, Ga)_5O_{12}$. There are also $Tb_3Al_5O_{12}$:Ce and $Lu_3Al_5O_{12}$:Ce where a part or the whole of Y is replaced with Tb, Lu or the like.

Other fluorescent materials include ZnS:Eu, $Zn_2GeO_4$:Mn and $MGa_2S_4$:Eu (M is at least one element selected from among Sr, Ca, Ba, Mg and Zn, and X is at least one element selected from among F, Cl, Br and I).

The fluorescent materials described above may also include at least one element selected from among Tb, Cu, Ag, Au, Cr, Nd, Dy, Co, Ni and Ti instead of, or in addition to Eu as required.

The Ca—Al—Si—O—N based oxynitride glass fluorescent material is a fluorescent material composed mainly of an oxynitride glass comprising 20 to 50 mol % of $CaCO_3$ based on CaO, 0 to 30 mol % of $Al_2O_3$, 25 to 60 mol % of $SiO$, 5 to 50 mol % of AlN and 0.1 to 20 mol % of rare earth oxide or transition metal oxide, with the five components totaling 100 mol %. In the fluorescent material composed mainly of the oxynitride glass, it is preferable that the nitrogen content is 15% by weight or less, and the fluorescent glass preferably contains, in addition to rare earth element ions, 0.1 to 10 mol % of other rare earth element ions in the form of rare earth oxide as a coactivation agent.

A fluorescent material other than those described above but with similar performance, operation and effect may also be used.

For the fluorescent material, it is preferable to combine a fluorescent material having a peak emission at 535 nm or shorter wavelength and a fluorescent material having peak emission at 645 nm or longer wavelength. In case two or more kinds of fluorescent material are combined, it is preferable that the difference between the shortest peak emission wavelength and the longest peak emission wavelength is 100 nm or larger, more preferably 110 nm or larger, as measured for each fluorescent material individually. This enables it to provide a light emitting device having a broad emission spectrum and high color rendering performance. Alternatively, a different fluorescent material that has a peak emission wavelength between the shortest peak emission wavelength and the longest peak emission wavelength, or one kind of fluorescent material that can achieve the object described above may be used. In case the light emitting device is constituted by combining two or more kinds of fluorescent materials and the emission spectrum of the light emitting device is measured, the difference in the peak emission wavelength becomes less than 110 nm described above.

More specifically, it is preferable to combine the following two kinds of fluorescent materials so as to achieve the predetermined emission spectrum of the present invention. The YAG fluorescent material described below emits yellow light of broad spectrum, and the nitride fluorescent material described below emits red light of broad spectrum, so that use of both fluorescent materials easily achieves the predetermined emission spectrum of the present invention and provides for a light emitting device having high color rendering performance.

(a) YAG fluorescent materials having peak emission wavelength in a region from 500 nm to 600 nm (preferably not longer than 535 nm)

The YAG fluorescent material refers to a fluorescent material having garnet structure represented by $M_xA_yD_z$, where M represents a metal element selected from among Sc, Y, La, Ce, Pr, Nd, Sm, Eu, Gd, Tb, Dy, Ho, Er, Tm, Yb and Lu, A represents Al or B, D represents O and/or N, while x, y and z have values in the following ranges.

$1 \leq x \leq 4$
$4 \leq y \leq 6$
$5 \leq z \leq 15$ (b) Nitride fluorescent materials having peak emission wavelength in a region from 600 nm (preferably 645 nm) to 700 nm.

The nitride fluorescent material refers to a single fluorescent material or a mixture represented by $M_xA_yD_z$, and/or $M_hA_iE_jD_l$, where M represents metal element including one selected from among Sc, Y, La, Ce, Pr, Nd, Sm, Eu, Gd, Tb, Dy, Ho, Er, Tm, Yb and Lu, and one selected from among Mg, Ca, Sr, Ba and Zn, A represents metal element including Si or Ge, E represents metal element including Al or B, D represents O and/or N, while x, y, z, h, i, j and l have values in the following ranges.

$1 \leq x \leq 3$
$3 \leq y \leq 7$
$4 \leq z \leq 17$
$1 \leq h \leq 3$
$1 \leq i \leq 3$
$1 \leq j \leq 3$
$3 \leq l \leq 14$ Color rendering performance can be further improved by using the following rare earth element aluminate fluorescent material in addition to the YAG fluorescent material and the nitride fluorescent material described above, as the energy intensity at the third wavelength is increased.

(c) Alkaline earth element aluminate fluorescent materials having peak emission wavelength in a region from 450 nm to 550 nm The alkaline earth element aluminate fluorescent material refers to a fluorescent material represented by MxAyDz, where M represents metal element including one selected from among Sc, Y, La, Ce, Pr, Nd, Sm, Eu, Gd, Tb, Dy, Ho, Er, Tm, Yb and Lu and one selected from among Mg, Ca, Sr, Ba and Zr, A represents Al or B, D represents O and/or N, while x, y and z have values in the following ranges.

$2 \leq x \leq 6$
$10 \leq y \leq 18$
$11 \leq z \leq 33$

EXAMPLES

Examples 1 to 8

Figure 3:
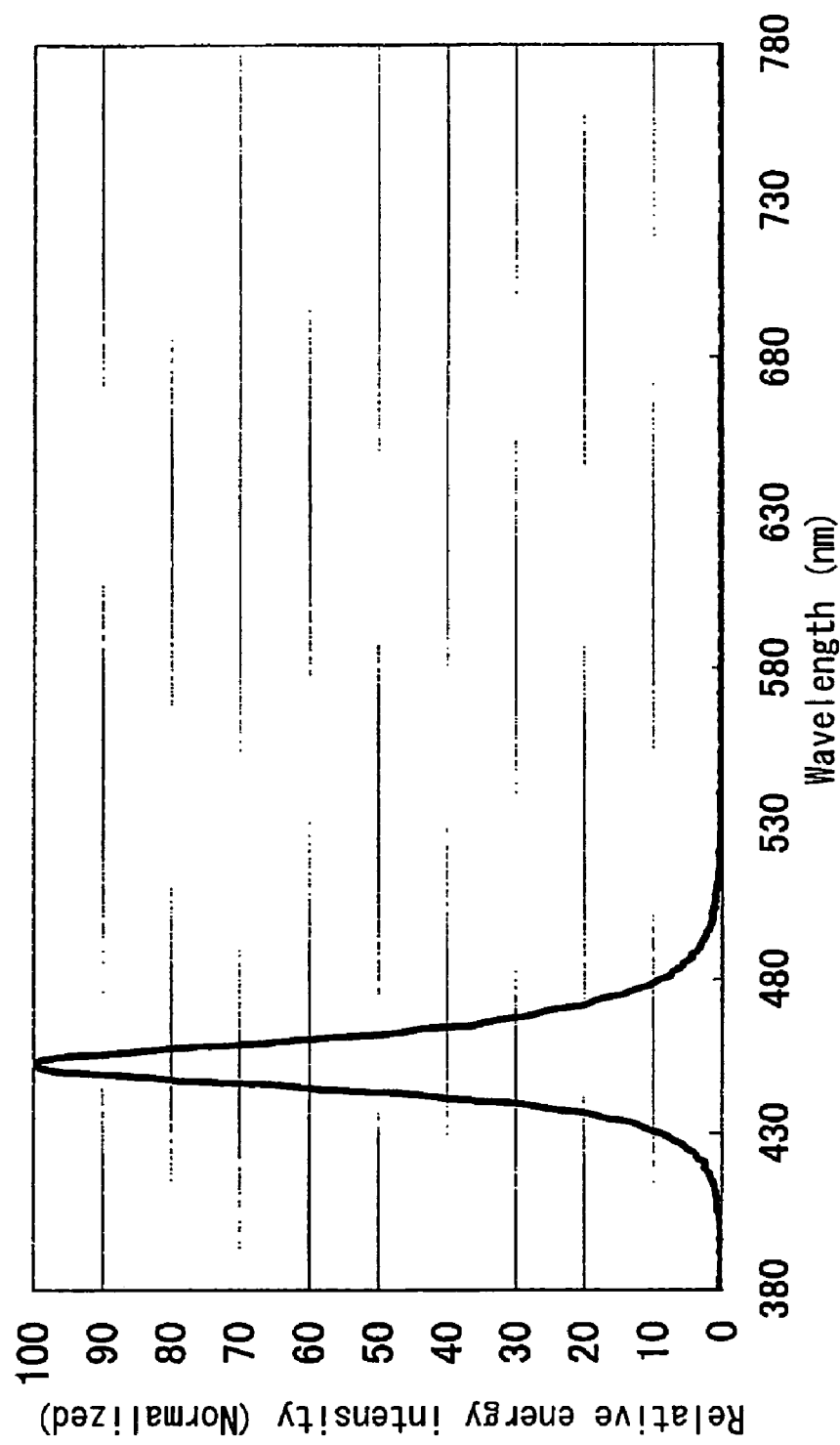
FIG. 3 shows the emission spectrum of a light emitting element used in Examples.
Figure 4:
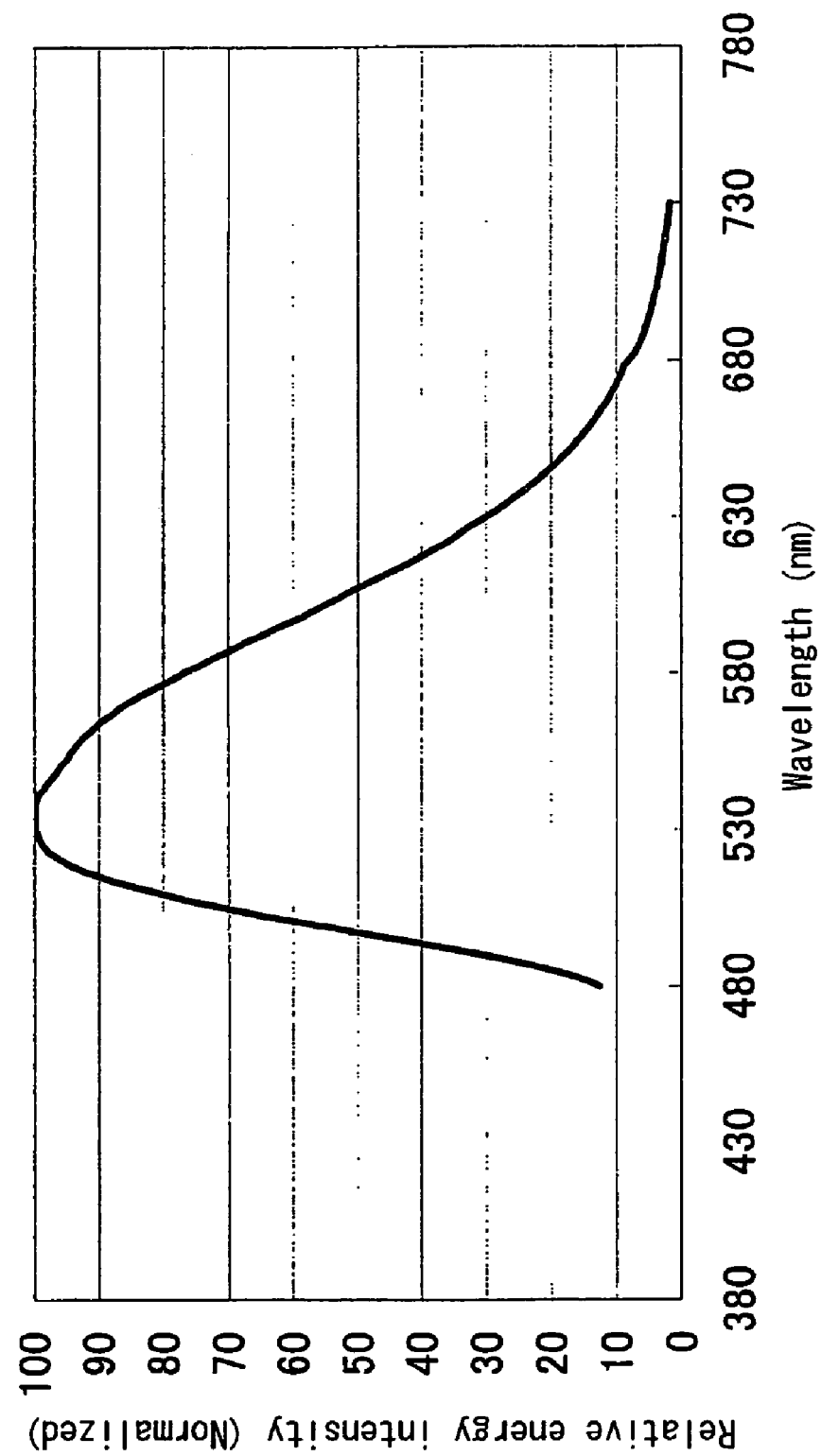
FIG. 4 shows the emission spectrum of a fluorescent material having a composition of $Y_3(Al, Ga)_5O_{12}$:Ce.
Figure 5:
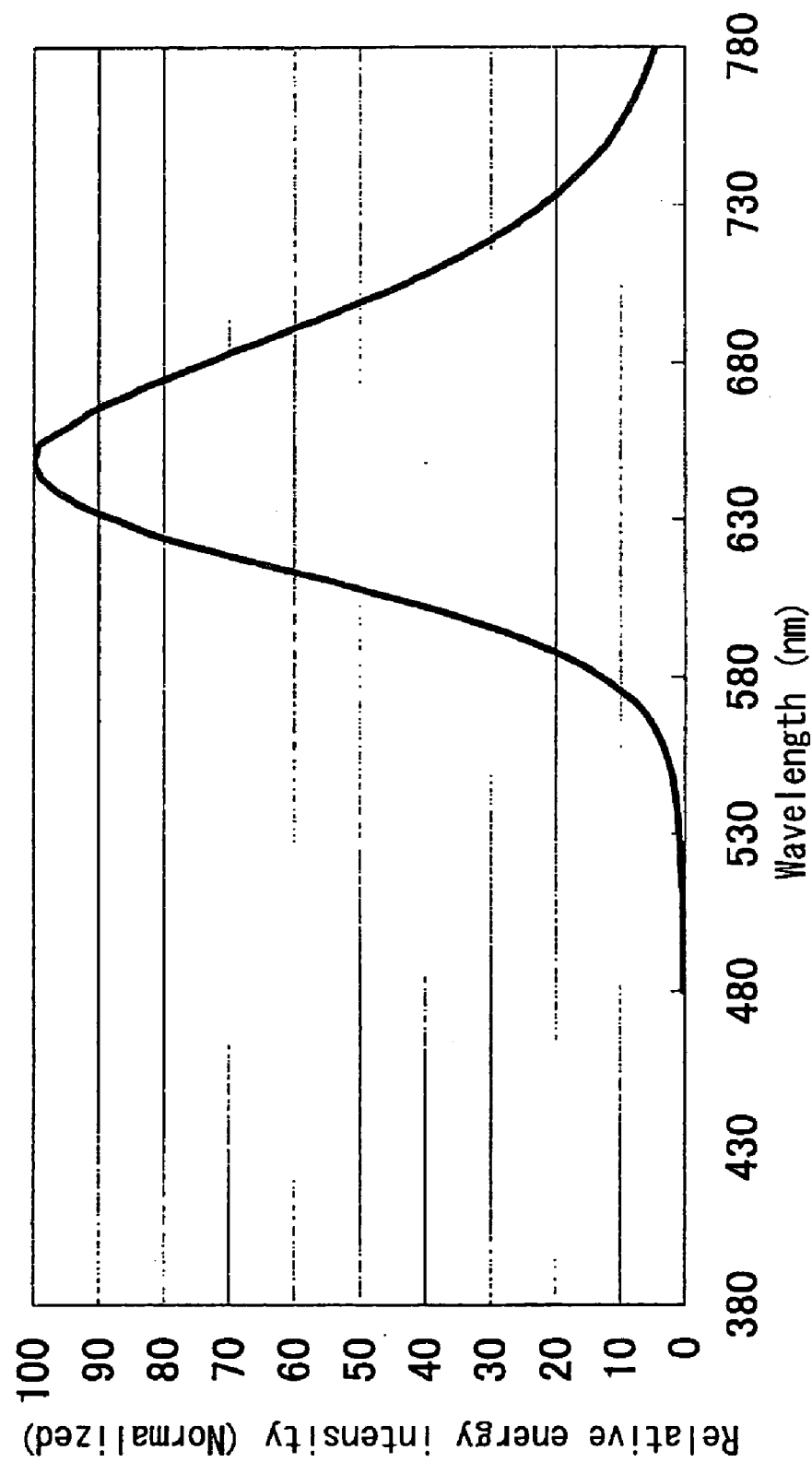
FIG. 5 shows the emission spectrum of a fluorescent material having a composition of $CaSiAlB_xN_{3+x}$:Eu.
Figure 6:
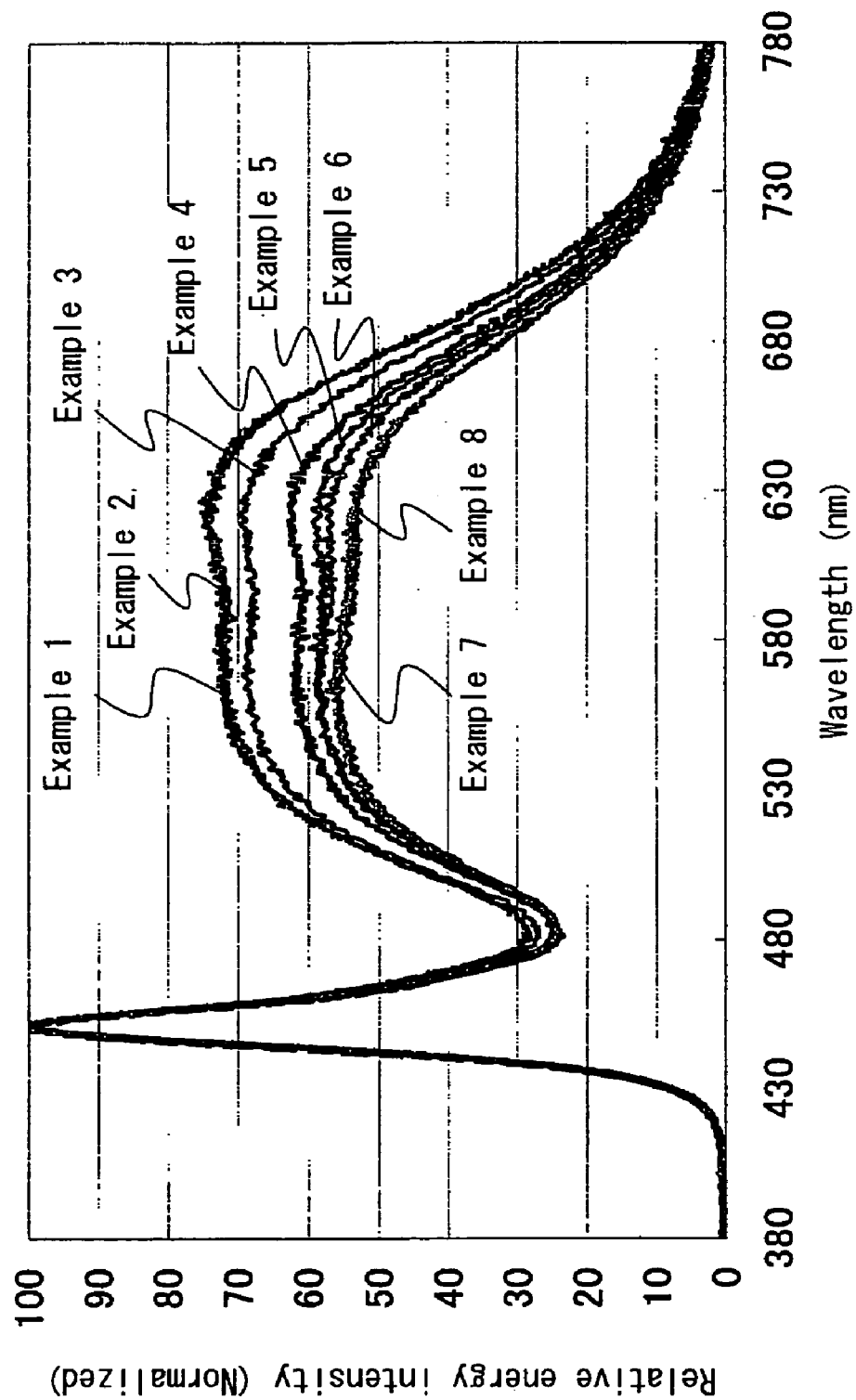
FIG. 6 shows the emission spectra of Examples 1 to 8.

The light emitting device of the embodiment is used for the light emitting device of Examples 1 to 8. FIG. 1 is a schematic perspective view showing a light emitting device according to the embodiment. FIG. 2 is a sectional view showing the light emitting device according to the embodiment taken along lines II-II. FIG. 3 shows the emission spectrum of the light emitting element used in Example. FIG. 4 shows the emission spectrum of a fluorescent material having composition of $Y_3(Al, Ga)_5O_{12}$:Ce. FIG. 5 shows the emission spectrum of a fluorescent material having composition of $CaSiAlB_xN_{3+x}$:Eu. The fluorescent material is excited with light having wavelength of 460 nm. FIG. 6 shows the emission spectra of Examples 1 to 8. Description of the light emitting device 100 of Examples will be partially omitted in consideration of the description of the light emitting device of the embodiment. Light colors and chromatic coordinates referred to in this specification are based on the CIE system defined by CIE, unless otherwise specified.

The light emitting device of Examples 1 to 8 are constituted by using the light emitting element 10, the package 20 having a recess formed by the bottom surface 20a and the side face 20b and the wavelength converting member 50 made by mixing the fluorescent material 52 in the resin 51.

The package 20 is formed from ceramics based on $Al_2O_3$ with dimensions of 350 mm square and 10 mm in height.

The light emitting element 10 is an ITO dice measuring 600 μm square having a peak emission at wavelength of about 450 nm. The light emitting element 10 emits blue light. A zener diode is used as the protective element 11.

The fluorescent material 52 is constituted from a fluorescent material having composition of $Y_3(Al, Ga)_5O_{12}$:Ce and a fluorescent material having composition of $CaSiAlB_xN_{3+x}$:Eu (x>0). The first YAG fluorescent material has a broad emission spectrum with a peak emission wavelength of around 530 nm. The nitride fluorescent material has a broad emission spectrum with a peak emission wavelength of about 650 nm. Proportion of the fluorescent material 52 in the resin 51 is (Weight of resin 51):(Weight of first YAG fluorescent material):(Weight of nitride fluorescent material)=3:0.40–0.60:0.065–0.095. The quantity of the fluorescent material 52 is the total weight of the first YAG fluorescent material and the nitride fluorescent material which are uniformly mixed in the resin 51. Uniformly mixed fluorescent material is potted in the recess of the package 20 to form the wavelength converting member 50. Since the package 20 is very small, the wavelength converting member 50 may show different chromatic coordinate values even when having the same mix proportion, depending on the state of dispersion of the fluorescent material 52 in the wavelength converting member 50 and the quantity potted.

Table 1 shows the light emission characteristics of the light emitting devices of Examples 1 to 8.

TABLE 1

| | | Example 1 | Example 2 | Example 3 | Example 4 | Example 5 | Example 6 | Example 7 | Example 8 |
|---|---|---|---|---|---|---|---|---|---|
| Mix proportion by weight | $Y_3(Al,Ga)_5O_8$:Ce | 100 | 100 | 100 | 100 | 100 | 100 | 100 | 100 |
| | $CaSiAlB_xN_{3+x}$:Eu | 18 | 18 | 17 | 17 | 17 | 17 | 17 | 17 |
| Color tone | x | 0.378 | 0.377 | 0.372 | 0.367 | 0.363 | 0.360 | 0.356 | 0.355 |
| | y | 0.378 | 0.378 | 0.373 | 0.363 | 0.359 | 0.360 | 0.356 | 0.355 |
| Peak emission wavelength | $\lambda p$ [nm] | 451 | 452 | 451 | 450 | 451 | 451 | 451 | 451 |
| Correlated color temperature | Tcp [K] | 4072 | 4089 | 4202 | 4297 | 4398 | 4500 | 4623 | 4650 |
| Deviation | Duv | 0.002 | 0.002 | 0.001 | −0.002 | −0.003 | −0.002 | −0.003 | −0.003 |
| General color rendering index | Ra | 91.4 | 91.6 | 91.2 | 91.8 | 92.5 | 91.6 | 91.5 | 91.5 |
| Special color rendering index | R1 | 91.6 | 91.9 | 91.5 | 93.0 | 93.7 | 92.3 | 92.3 | 92.4 |
| | R2 | 93.2 | 93.4 | 92.9 | 93.5 | 94.6 | 93.5 | 93.6 | 93.5 |
| | R3 | 92.2 | 92.3 | 91.8 | 91.0 | 91.8 | 91.5 | 91.4 | 91.1 |
| | R4 | 91.0 | 91.4 | 91.0 | 91.7 | 92.1 | 91.2 | 91.0 | 91.2 |
| | R5 | 89.8 | 90.1 | 89.8 | 91.3 | 91.8 | 90.6 | 90.5 | 90.6 |
| | R6 | 88.3 | 88.6 | 88.0 | 88.2 | 89.1 | 88.0 | 87.8 | 87.7 |
| | R7 | 95.8 | 95.9 | 95.4 | 94.8 | 95.5 | 95.2 | 95.0 | 95.1 |
| | R8 | 89.2 | 89.5 | 89.0 | 90.9 | 91.7 | 90.2 | 90.1 | 90.3 |
| | R9 | 71.0 | 71.7 | 70.0 | 75.7 | 78.4 | 73.4 | 73.2 | 73.6 |
| | R10 | 81.9 | 82.4 | 81.4 | 82.4 | 84.5 | 82.3 | 82.3 | 82.1 |

TABLE 1-continued

|  |  | Example 1 | Example 2 | Example 3 | Example 4 | Example 5 | Example 6 | Example 7 | Example 8 |
|---|---|---|---|---|---|---|---|---|---|
|  | R11 | 89.2 | 89.7 | 89.4 | 90.2 | 90.3 | 89.6 | 89.3 | 89.4 |
|  | R12 | 63.9 | 64.2 | 63.8 | 65.4 | 64.6 | 63.3 | 62.8 | 62.7 |
|  | R13 | 92.0 | 92.3 | 91.8 | 93.1 | 94.2 | 92.8 | 92.8 | 92.9 |
|  | R14 | 95.2 | 95.3 | 95.1 | 94.6 | 95.0 | 95.0 | 94.9 | 94.7 |
|  | R15 | 90.8 | 91.0 | 90.6 | 93.3 | 94.3 | 92.3 | 92.5 | 92.7 |
| Third wavelength | λ [nm] | 480 | 481 | 481 | 482 | 484 | 483 | 480 | 481 |
| Energy intensity ratio | First wavelength | 100 | 100 | 100 | 100 | 100 | 100 | 100 | 100 |
|  | Third wavelength | 28.1 | 28.2 | 26.9 | 23.9 | 24.3 | 24.3 | 23.9 | 23.3 |
|  | 650 nm | 67.8 | 69.7 | 62.1 | 56.2 | 53.7 | 51.4 | 48.6 | 47.4 |
|  | 680 nm | 46.2 | 45.9 | 42.5 | 38.0 | 35.9 | 34.3 | 31.8 | 32.2 |

In Examples 1 to 8, various light emitting devices having color temperatures ranging from 4,000 K to 5,000 K were fabricated. General color rendering index (Ra) and special color rendering index (R1 to R15) were determined by making reference to standard light having the same correlated color temperature, by the method specified in JIS Z 8726-1990. Ditto for Examples 9 to 17 and Comparative Examples 1 to 9.

The light emitting devices of Examples 1 to 8 all showed very high values of general color rendering index (Ra), 91 or higher. The light emitting devices of Examples 1 to 8 also showed very high values of special color rendering index (R1 to R15). Values of special color rendering index (R9) related to red color of light, in particular, were 70 or higher. Thus higher color rendering performance was achieved than in the case of the light emitting device of Comparative Example to be described later, namely the white light emitting device consisting of a blue light emitting element and a yellow light emitting fluorescent material (second YAG fluorescent material having composition of $(Y, Gd)_3Al_5O_{12}:Ce$) that showed light with an insufficient red component.

Examples 9 to 17

Figure 7:
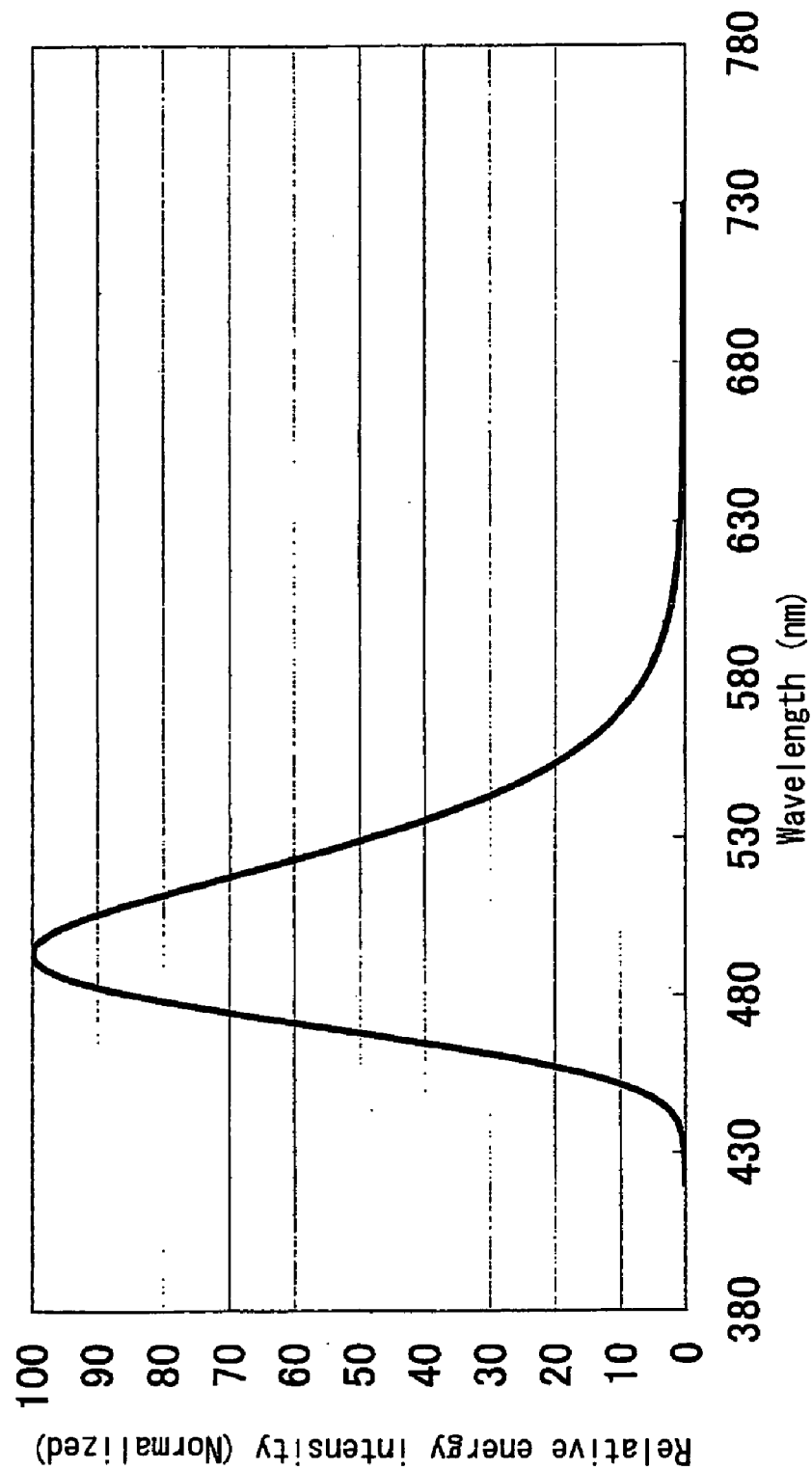
FIG. 7 shows the emission spectrum of a fluorescent material having a composition of $Sr_4Al_{14}O_{25}$:Eu.
Figure 8:
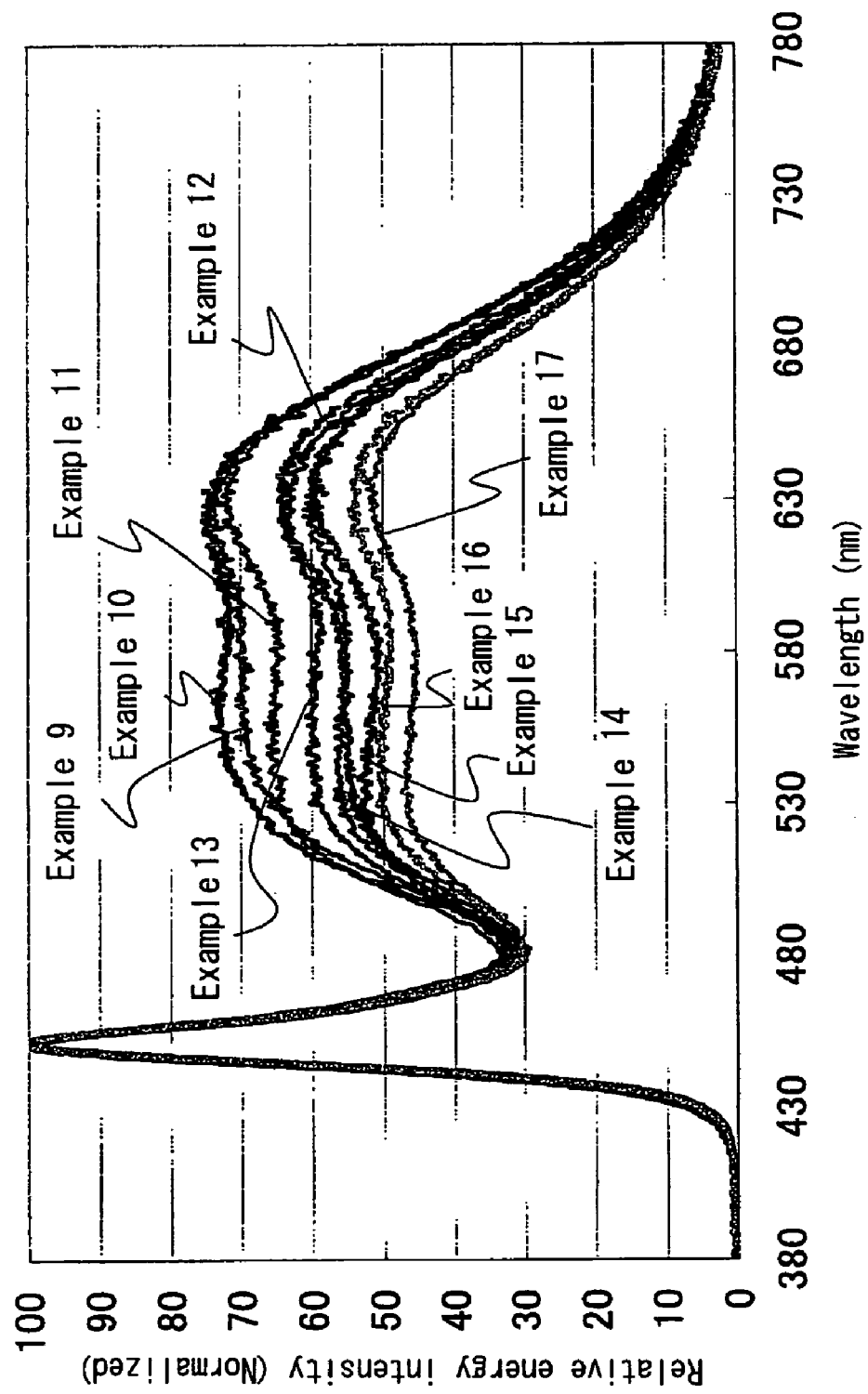
FIG. 8 shows the emission spectra of Examples 9 to 17.

In Examples 9 to 17, an alkaline earth metal element aluminate fluorescent material having a composition of $Sr_4Al_{14}O_{25}:Eu$ was used in addition to the fluorescent material 52 of Examples 1 to 8. FIG. 7 shows the emission spectrum of a fluorescent material having composition of $Sr_4Al_{14}O_{25}:Eu$. FIG. 8 shows the emission spectrum of Examples 9 to 17.

The light emitting devices of Examples 9 to 17 are the same as the light emitting devices 100 of Examples 1 to 8 except for the fluorescent material 52. In Examples 9 to 17, a YAG fluorescent material having composition of $Y_3(Al, Ga)_5O_{12}:Ce$, a nitride fluorescent material having composition of $CaSiAlB_XN_{3+X}:Eu$ (x>0), and an alkaline earth metal element aluminate fluorescent material of $Sr_4Al_{14}O_{25}:Eu$ were used for the fluorescent material 52. The alkaline earth metal element aluminate fluorescent material of $Sr_4Al_{14}O_{25}:Eu$ emits light with a somewhat broad emission spectrum having a peak emission wavelength around 495 nm, when excited with light of about 400 nm. Proportion of the fluorescent material 52 mixed in the resin 51 is (Weight of resin 51):(Weight of first YAG fluorescent material):(Weight of nitride fluorescent material):(Weight of alkali earth metal element aluminate fluorescent material)=3:0.25–0.60:0.065–0.100:0.05–0.40. In Examples 11 to 17, a higher content of the alkali earth metal element aluminate fluorescent material was included than in Example 9 or 10.

Table 2 shows the light emission characteristics of the light emitting devices of Examples 9 to 17.

TABLE 2

|  |  | Example 9 | Example 10 | Example 11 | Example 12 | Example 13 | Example 14 | Example 15 | Example 16 | Example 17 |
|---|---|---|---|---|---|---|---|---|---|---|
| Mix proportion by weight | $Y_3(Al,Ga)_5O_8:Ce$ | 100 | 100 | 100 | 100 | 100 | 100 | 100 | 100 | 100 |
|  | $CaSiAlB_XN_{3+x}:Eu$ | 17 | 17 | 19 | 20 | 20 | 20 | 23 | 23 | 23 |
|  | $Sr_4Al_{14}O_{25}:Eu$ | 21 | 21 | 60 | 63 | 63 | 63 | 91 | 91 | 91 |
| Color tone | x | 0.375 | 0.374 | 0.369 | 0.363 | 0.361 | 0.357 | 0.353 | 0.350 | 0.345 |
|  | y | 0.376 | 0.380 | 0.373 | 0.357 | 0.365 | 0.359 | 0.351 | 0.348 | 0.341 |
| Peak emission wavelength | λp [nm] | 451 | 451 | 451 | 453 | 452 | 452 | 450 | 451 | 452 |
| Correlated color temperature | Tcp [K] | 4152 | 4200 | 4301 | 4400 | 4512 | 4601 | 4685 | 4801 | 4967 |
| Deviation | Duv | 0.001 | 0.003 | 0.002 | −0.004 | 0.001 | −0.001 | −0.004 | −0.004 | −0.005 |
| General color rendering index | Ra | 93.3 | 92.0 | 96.2 | 97.3 | 96.2 | 97.3 | 96.6 | 97.3 | 95.8 |
| Special color rendering index | R1 | 93.9 | 92.1 | 97.2 | 96.9 | 97.2 | 98.4 | 95.4 | 97.3 | 94.4 |
|  | R2 | 94.4 | 93.1 | 97.0 | 98.3 | 98.0 | 98.7 | 98.0 | 98.8 | 96.5 |
|  | R3 | 92.8 | 92.4 | 94.8 | 96.5 | 96.0 | 95.5 | 95.9 | 95.3 | 97.0 |
|  | R4 | 93.5 | 92.3 | 96.7 | 99.2 | 95.7 | 97.6 | 97.7 | 99.0 | 98.2 |
|  | R5 | 92.2 | 90.5 | 95.5 | 97.1 | 95.1 | 96.6 | 96.8 | 97.3 | 95.4 |
|  | R6 | 90.3 | 88.9 | 93.7 | 94.7 | 94.0 | 94.4 | 95.1 | 94.2 | 93.8 |
|  | R7 | 96.8 | 96.6 | 98.8 | 98.2 | 97.7 | 98.6 | 99.1 | 99.0 | 97.5 |
|  | R8 | 92.2 | 90.4 | 96.5 | 97.4 | 95.9 | 98.1 | 94.6 | 97.9 | 94.0 |
|  | R9 | 78.5 | 72.8 | 90.3 | 93.0 | 91.2 | 97.4 | 85.0 | 93.9 | 82.2 |
|  | R10 | 85.2 | 82.6 | 91.5 | 98.2 | 93.4 | 95.0 | 97.8 | 97.2 | 95.5 |
|  | R11 | 92.3 | 91.0 | 95.6 | 96.6 | 95.5 | 96.3 | 94.2 | 96.1 | 96.1 |
|  | R12 | 67.2 | 65.1 | 70.5 | 72.0 | 68.4 | 70.0 | 73.6 | 70.4 | 70.2 |

TABLE 2-continued

| | | Example 9 | Example 10 | Example 11 | Example 12 | Example 13 | Example 14 | Example 15 | Example 16 | Example 17 |
|---|---|---|---|---|---|---|---|---|---|---|
| | R13 | 94.0 | 92.2 | 97.3 | 97.2 | 97.9 | 99.4 | 95.8 | 98.0 | 94.6 |
| | R14 | 95.6 | 95.5 | 96.8 | 97.5 | 97.5 | 97.1 | 97.2 | 97.0 | 97.8 |
| | R15 | 93.0 | 90.6 | 95.7 | 94.4 | 95.4 | 96.3 | 92.7 | 94.7 | 90.8 |
| Third wavelength | λ [nm] | 482 | 481 | 480 | 482 | 484 | 480 | 481 | 480 | 485 |
| Energy intensity ratio | First wavelength | 100 | 100 | 100 | 100 | 100 | 100 | 100 | 100 | 100 |
| | Third wavelength | 29.2 | 30.2 | 32.7 | 31.8 | 33.0 | 31.5 | 32.3 | 29.8 | 30.7 |
| | 650 nm intensity | 67.9 | 68.7 | 67.3 | 61.0 | 59.3 | 56.8 | 57.1 | 51.1 | 49.3 |
| | 680 nm intensity | 45.6 | 46.6 | 46.3 | 41.4 | 40.1 | 39.4 | 39.8 | 35.4 | 33.6 |

The light emitting devices of Examples 9 to 17 all showed very high color rendering performance with values of general color rendering index (Ra) of 92 or higher. The light emitting devices of Examples 11 to 17 that included increased proportions of alkali earth metal element aluminate fluorescent material, in particular, showed extremely high color rendering performance with color rendering indexes of 95 or higher. The light emitting devices of Examples 9 to 17 also showed very high color rendering performance with special color rendering indexes (R1 to R15). Values of special color rendering index (R9) related to red color of light, in particular, were 70 or higher, and 80 or higher in Examples 11 to 17 that included increased proportions of alkali earth metal element aluminate fluorescent material. Thus higher color rendering performance was achieved than in the case of the light emitting device of Comparative Examples to be described later, namely the white light emitting device consisting of a blue light emitting element and a yellow light emitting fluorescent material (second YAG fluorescent material of (Y, Gd)$_3$Al$_5$O$_{12}$:Ce) that showed light with an insufficient red component. Color rendering performance can be improved further by mixing a fluorescent material that complements the energy intensity at the third wavelength in the fluorescent material 52. Such a fluorescent material that complements the energy intensity at the third wavelength also diffuses the light from the exciting light source, so as to efficiently excite the fluorescent material that emits light of longer wavelength in the visible light region (for example, nitride fluorescent material), thereby further enhancing the red component.

Figure 9:
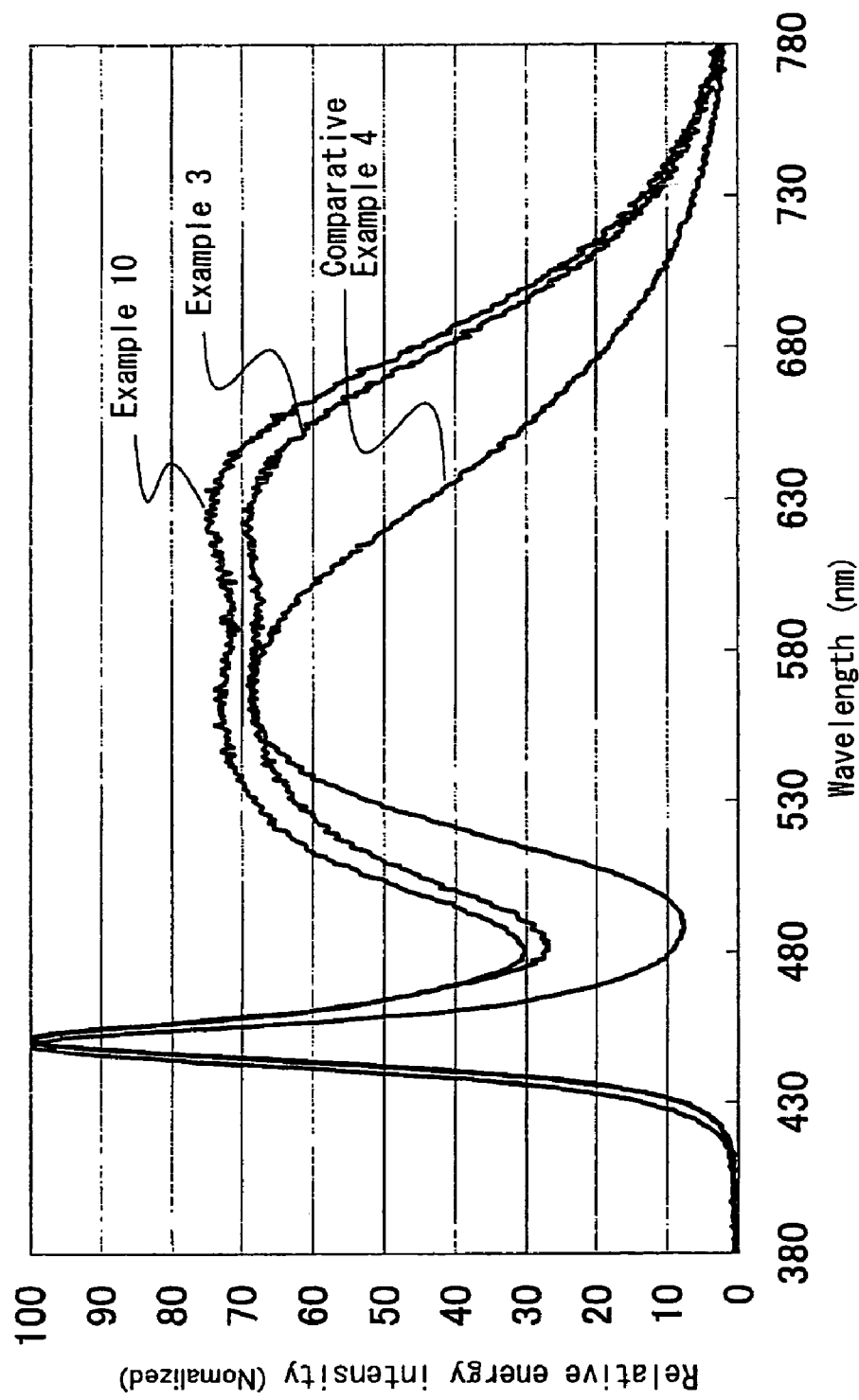
FIG. 9 shows a comparison of emission spectra.

FIG. 9 compares the emission spectra, in terms of energy intensity at the color temperature of 4200K among Example 3, Example 10 and Comparative Example 4.

Examples 1 to 17 have emission spectra having peak energy intensities of the light emitting element 10 at about 450 nm (the first wavelength), peak energy intensities of the fluorescent material 52 in a range from 530 nm to 650 nm (the second wavelength) and minimum energy intensities at about 480 nm (the third wavelength) between the first wavelength and the second wavelength.

In the emission spectra shown in the figure, energy intensity at the third wavelength (488 nm) in Comparative Example 4 is 8%, while energy intensities at the third wavelength (481 nm) in Example 3 and Example 10 are 27% and 30%, respectively. Energy intensity in the wavelength region that provides the red component (for example, the fourth wavelength of 650 nm) was 33% in the Comparative Example, but was 62% and 69% in Example 3 and Example 10, respectively. Moreover, energy intensity in the wavelength region that provides the red component (for example, the fifth wavelength of 680 nm) was 18% in the Comparative Example, but was 43% and 47% in Example 3 and Example 10, respectively.

While energy intensities at the first wavelength, the second wavelength and the third wavelength were shown for Example 3, Example 10 and Comparative Example 4, energy intensities at various wavelengths were measured for other Examples as well. These measurements show that the energy intensity at the third wavelength was from 20% to 35% relative to energy intensity at the first wavelength (100%) in Examples 1 to 17. The object of the present invention can be achieved by setting the energy intensity at the third wavelength in a range from 15% to 150%. In Comparative Examples 1 to 9, the energy intensities at the third wavelength were from 7% to 10%. In this range, the general color rendering index (Ra) is not higher than 73.7.

Energy intensities in the wavelength region that provides the red component (650 nm) were from 45% to 80% in Examples 1 to 17. The object of the present invention can be achieved by setting the energy intensity at wavelength 650 nm in a range from 45% to 200%. In Comparative Examples 1 to 9, the energy intensities at wavelength 650 nm were from 24% to 42%. In this range, the special color rendering index (R9) is 0 or lower.

Energy intensities in the wavelength region that provides the red component (for example, the fifth wavelength of 680 nm) was from 25% and 60% in Examples 1 to 17. The object of the present invention can be achieved by setting the energy intensity at wavelength of 680 nm in a range from 25% to 200%. In Comparative Examples 1 to 9, the energy intensities at wavelength 680 nm were from 13% to 23%. In this range, the special color rendering index (R9) is 0 or lower.

Comparative Examples 1 to 9

Figure 10:
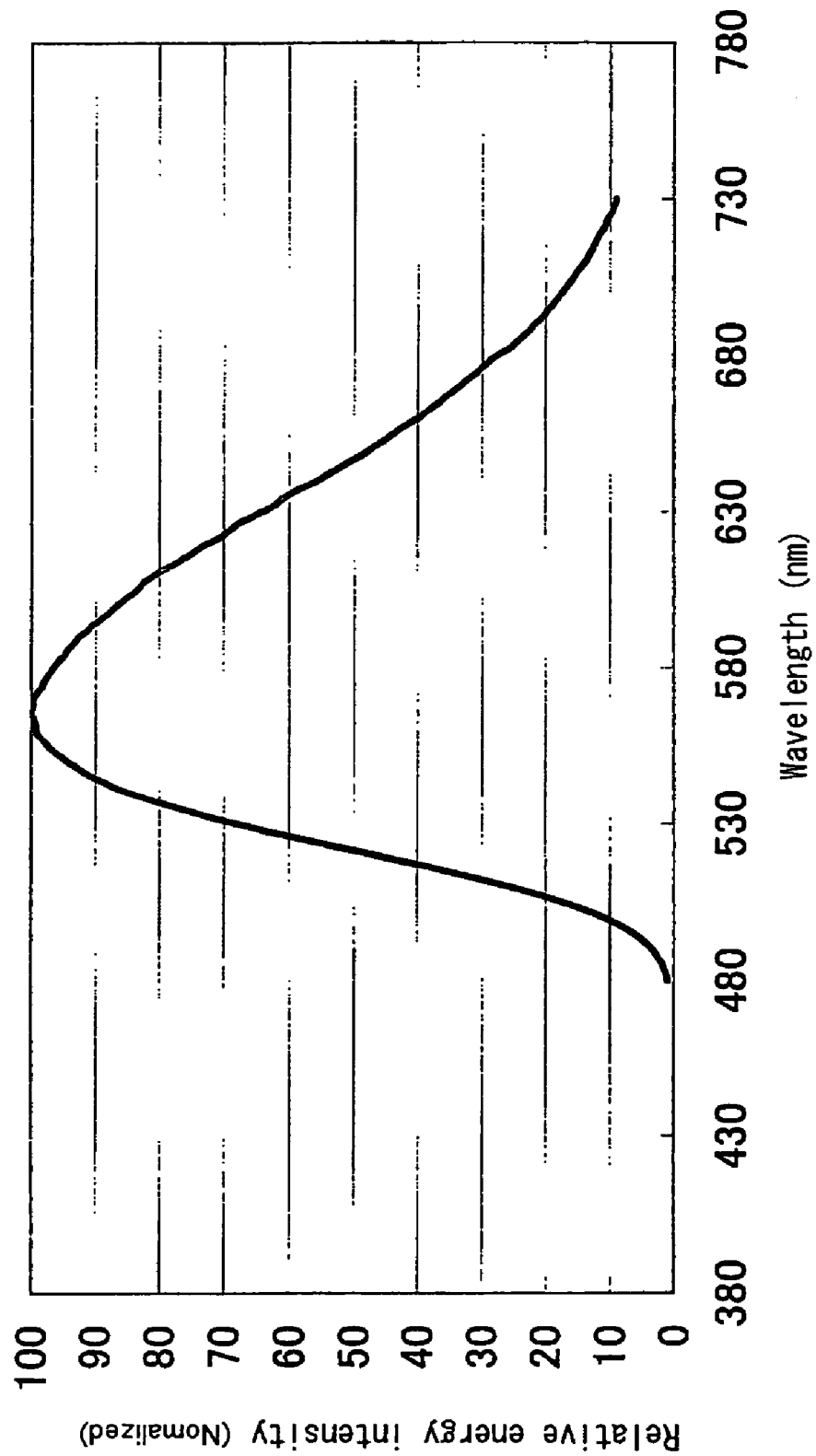
FIG. 10 shows the emission spectrum of a fluorescent material having composition of $(Y, Gd)_3Al_5O_{12}$:Ce.
Figure 11:
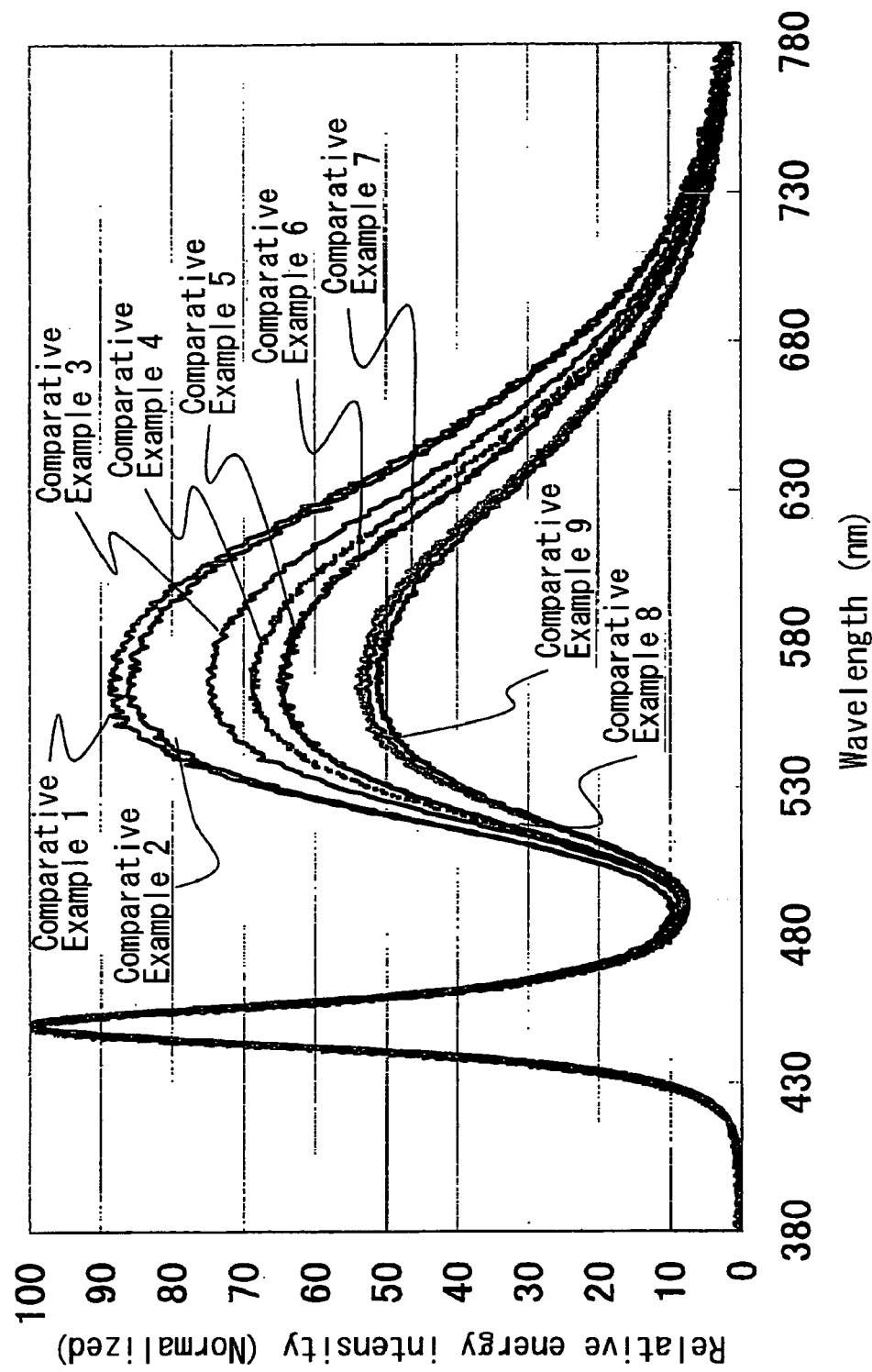
FIG. 11 shows the emission spectrum of Comparative Examples 1 to 9.

The light emitting devices of Comparative Examples 1 to 9 are those of Examples 1 to 17 where the second YAG fluorescent material having composition of (Y, Gd)$_3$Al$_5$O$_{12}$:Ce is used for the fluorescent material 52. FIG. 10 shows the emission spectrum of the fluorescent material having a composition of (Y, Gd)$_3$Al$_5$O$_{12}$:Ce, excited with light of 460 nm. FIG. 11 shows the emission spectra of Comparative Examples 1 to 9.

The light emitting devices of Comparative Examples 1 to 9 are the same as the light emitting devices 100 of Examples 1 to 17 except for the fluorescent material 52. In Comparative Examples 1 to 9, the second YAG fluorescent material having a composition of (Y, Gd)$_3$Al$_5$O$_{12}$:Ce is used as the fluorescent material 52. The second YAG fluorescent material has a broad emission spectrum with a peak emission at around 570 nm. (Weight of resin 51):(Weight of second YAG fluorescent material)=3:0.220–0.300.

Table 3 shows the light emission characteristics of the light emitting devices of Comparative Examples 1 to 9.

TABLE 3

|  |  | Comparative Example 1 | Comparative Example 2 | Comparative Example 3 | Comparative Example 4 | Comparative Example 5 | Comparative Example 6 | Comparative Example 7 | Comparative Example 8 | Comparative Example 9 |
| --- | --- | --- | --- | --- | --- | --- | --- | --- | --- | --- |
| Color tone | x | 0.387 | 0.384 | 0.377 | 0.372 | 0.366 | 0.366 | 0.354 | 0.352 | 0.351 |
|  | y | 0.395 | 0.392 | 0.380 | 0.372 | 0.365 | 0.365 | 0.347 | 0.344 | 0.341 |
| Peak emission wavelength | $\lambda p$ [nm] | 450 | 450 | 449 | 449 | 450 | 449 | 451 | 451 | 450 |
| Correlated color temperature | Tcp [K] | 3964 | 4010 | 4109 | 4200 | 4343 | 4348 | 4653 | 4700 | 4735 |
| Deviation | Duv | 0.007 | 0.006 | 0.003 | −0.001 | −0.001 | −0.001 | −0.006 | −0.007 | −0.008 |
| General color rendering index | Ra | 68.1 | 68.5 | 68.9 | 69.6 | 71.0 | 70.9 | 73.3 | 73.7 | 73.6 |
| Special color rendering index | R1 | 64.7 | 65.1 | 66.2 | 67.5 | 69.0 | 68.9 | 72.5 | 73.1 | 73.2 |
|  | R2 | 74.3 | 74.8 | 75.2 | 75.8 | 77.5 | 77.3 | 79.6 | 80.0 | 79.7 |
|  | R3 | 79.8 | 80.1 | 79.1 | 78.6 | 79.9 | 79.7 | 79.5 | 79.5 | 78.8 |
|  | R4 | 66.2 | 66.4 | 67.0 | 67.7 | 68.7 | 68.6 | 70.9 | 71.3 | 71.6 |
|  | R5 | 62.5 | 63.1 | 64.2 | 65.4 | 67.0 | 66.9 | 70.3 | 70.9 | 71.1 |
|  | R6 | 61.0 | 61.7 | 62.0 | 62.6 | 64.7 | 64.5 | 66.9 | 67.3 | 66.9 |
|  | R7 | 82.3 | 82.3 | 81.6 | 81.5 | 82.5 | 82.4 | 83.1 | 83.3 | 82.9 |
|  | R8 | 54.2 | 54.4 | 55.8 | 57.5 | 59.1 | 59.0 | 63.3 | 64.1 | 64.4 |
|  | R9 | −28.2 | −27.8 | −24.0 | −19.3 | −15.1 | −15.5 | −3.9 | −1.6 | −1.3 |
|  | R10 | 36.9 | 37.9 | 38.2 | 39.1 | 42.6 | 42.2 | 46.2 | 47.0 | 46.2 |
|  | R11 | 56.9 | 57.3 | 58.1 | 59.0 | 60.1 | 60.0 | 62.6 | 63.1 | 63.6 |
|  | R12 | 25.0 | 26.1 | 27.6 | 29.2 | 31.4 | 31.0 | 34.7 | 35.2 | 35.3 |
|  | R13 | 65.7 | 66.3 | 67.3 | 68.4 | 70.2 | 70.1 | 73.6 | 74.2 | 74.1 |
|  | R14 | 88.1 | 88.3 | 87.7 | 87.3 | 88.1 | 88.0 | 87.8 | 87.3 |  |
|  | R15 | 59.9 | 60.4 | 62.5 | 64.6 | 66.6 | 66.5 | 72.0 | 72.9 | 73.3 |
| Third wavelength | $\lambda$ [nm] | 490 | 488 | 491 | 488 | 490 | 490 | 491 | 491 | 490 |
| Energy intensity ratio | First wavelength | 100 | 100 | 100 | 100 | 100 | 100 | 100 | 100 | 100 |
|  | Third wavelength | 9.3 | 9.6 | 8.2 | 7.6 | 8.5 | 8.6 | 8.0 | 7.9 | 7.4 |
|  | 650 nm intensity | 41.8 | 40.1 | 35.6 | 32.7 | 30.2 | 30.2 | 24.8 | 24.7 | 23.8 |
|  | 680 nm intensity | 23.3 | 23.2 | 20.2 | 18.3 | 17.7 | 17.5 | 14.5 | 14.7 | 13.5 |

The light emitting devices of Comparative Examples 1 to 9 all showed general color rendering indexes (Ra) in a range from 68.1 to 73.7. The light emitting devices of Comparative Examples 1 to 9 also showed special color rendering indexes (R9) related to the red color of light in a range from −28.2 to −1.3.

The light emitting device of the present invention can be used in a liquid crystal backlight light source, lighting apparatus, backlight light source for display, flash for a camera, auxiliary light source for videos, etc., and particularly in a lighting apparatus or light source requiring color rendering performance.

What is claimed is:

1. A light emitting device comprising:
    an exciting light source that emits visible light in a short wavelength region;
    a wavelength converting member that absorbs the light emitted by said exciting light source and emits light of a wavelength longer than that of the light from said exciting light source,
        wherein said light emitting device
        emits light with color temperature in a range from 4,000 K to 5,000K and
        has an emission spectrum in the visible light region with a wavelength at which the light from said exciting light source has a maximum energy intensity denoted as a first wavelength, a wavelength at which the light from said wavelength converting member has a maximum energy intensity denoted as a second wavelength, a wavelength lying between the first wavelength and the second wavelength at which the light from said light emitting device has a minimum energy intensity denoted as a third wavelength, and 650 nm denoted as a fourth wavelength, such that the proportion of the energy intensity at the first wavelength to the energy intensity at the third wavelength is from 100:20 to 100:100, and the proportion of the energy intensity at the first wavelength to the energy intensity at the fourth wavelength is from 100:45 to 100:200,
    wherein said emitting device emits light with a general color rendering index of 91 or higher.

2. The light emitting device according to claim 1, wherein said exciting light source is a light emitting element and said wavelength converting member comprises a fluorescent material.

3. The light emitting device according to claim 2, wherein said wavelength converting member comprises two or more, kinds of fluorescent materials of different compositions.

4. The light emitting device according to claim 1, wherein the emission spectrum is characterized in that, with 680 nm being denoted as the fifth wavelength, the proportion of the energy intensity at the first wavelength to the energy intensity at the fifth wavelength is from 100:25 to 100:200.

5. The light emitting device according to claim 1, wherein said wavelength converting member comprises a nitride fluorescent material that: includes at least one kind of group II element selected from the group consisting of Be, Mg, Ca, Sr, Ba and Zn, at least one kind of group IV element selected from the group consisting of C, Si, Ge, Sn, Ti, Zr and Hf; and at least one kind of group III element selected from the group consisting of Al, B and N with N included as an indispensable element, and activated with at least one kind of rare earth element selected from the group consisting of Y, La, Ce, Pr, Nd, Sm, Eu, Gd, Tb, Dy, Ho, Er and Lu.

6. The light emitting device according to claim 1, wherein said exciting light source has a peak emission wavelength, in a region from 400 nm to 420 nm, and said wavelength converting member has a peak emission wavelength in the short wavelength region.

7. The light emitting device according to claim 1, wherein said wavelength converting member comprises a fluorescent material having a peak emission at 535 nm or shorter wavelength and a fluorescent material having peak emission at 645 nm or longer wavelength.

8. The light emitting device according to claim 1, wherein said wavelength converting member comprises two or more kinds of fluorescent materials, and the difference between the shortest peak emission wavelength and the longest peak emission wavelength among the fluorescent materials is 100 nm or larger.

9. The light emitting device according to claim 1, wherein said wavelength converting member comprises a fluorescent materials having a garnet structure and a peak emission wavelength in a region from 500 nm to 600 nm, and a nitride fluorescent material having a peak emission wavelength in a region from 600 nm to 700 nm.

10. The light emitting device according to claim 9, wherein said wavelength converting member further comprises an alkaline earth element aluminate fluorescent material having a peak emission wavelength in a region from 450 nm to 550 nm.

11. The light emitting device according to claim 1, wherein a proportion of the energy intensity at the first wavelength to the energy intensity at the third wavelength is from 100:20 to 100:35.

12. The light emitting device according to claim 1, wherein the emission spectrum is characterized in that, with 680 nm being denoted as the fifth wavelength, the proportion of the energy intensity at the first wavelength to the energy intensity at the fifth wavelength is from 100:25 to 100:60.

13. The light emitting device according to claim 1, wherein the light emitting device emits light with a general color rendering index of 95 or higher.

14. The light emitting device according to claim 1, wherein the light emitting device emits light with a special color rendering index R9 of 80 or higher.

\* \* \* \* \*